US006479758B1

(12) United States Patent
Arima et al.

(10) Patent No.: US 6,479,758 B1
(45) Date of Patent: Nov. 12, 2002

(54) WIRING BOARD, SEMICONDUCTOR PACKAGE AND SEMICONDUCTOR DEVICE

(75) Inventors: Shuichi Arima, Fuchu (JP); Osamu Shimada, Fuchu (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/494,047

(22) Filed: Jan. 31, 2000

(30) Foreign Application Priority Data

Jan. 21, 2000 (JP) ........................................ 2000-012795

(51) Int. Cl.⁷ ................................................ H05K 1/16
(52) U.S. Cl. ........................ 174/260; 361/777; 361/780; 257/691
(58) Field of Search ................................. 174/261, 260; 361/777, 779, 780; 257/691

(56) References Cited

U.S. PATENT DOCUMENTS

| 4,855,537 A | | 8/1989 | Nakai et al. | |
| 5,631,502 A | | 5/1997 | Shimada | |
| 5,686,764 A | * | 11/1997 | Fulcher | 257/778 |
| 5,691,568 A | * | 11/1997 | Chou et al. | 257/691 |
| 5,847,936 A | * | 12/1998 | Forehand et al. | 361/794 |
| 6,163,071 A | * | 12/2000 | Yamamura | 257/691 |
| 6,198,635 B1 | * | 3/2001 | Shenoy et al. | 361/760 |

FOREIGN PATENT DOCUMENTS

| JP | 6-265599 | 9/1994 |
| WO | 98/47331 | 10/1998 |

* cited by examiner

*Primary Examiner*—Brian Sircus
*Assistant Examiner*—Brian S. Webb
(74) *Attorney, Agent, or Firm*—Finnegan, Henderson, Farabow, Garrett & Dunner, L.L.P.

(57) ABSTRACT

In a wiring board having a plurality of wiring layers, a plurality of signal wiring terminals and a plurality of power supply terminals are arranged on the principal plane of the wiring board, the signal wiring terminals or the power supply terminals being connected to any one of inner layers of the wiring layers, and signal wiring terminals, which are connected to wirings formed on the same layer, among the plurality of signal wiring terminals are arranged so that at least one side of the inside and outside of a region, in which the signal wiring terminals connected to the wirings formed on the same layer are formed, is surrounded by the power supply terminals. Thus, even if the signal wirings are closely arranged, it is possible to prevent crosstalk from occurring and it is possible to prevent the size from increasing.

19 Claims, 14 Drawing Sheets

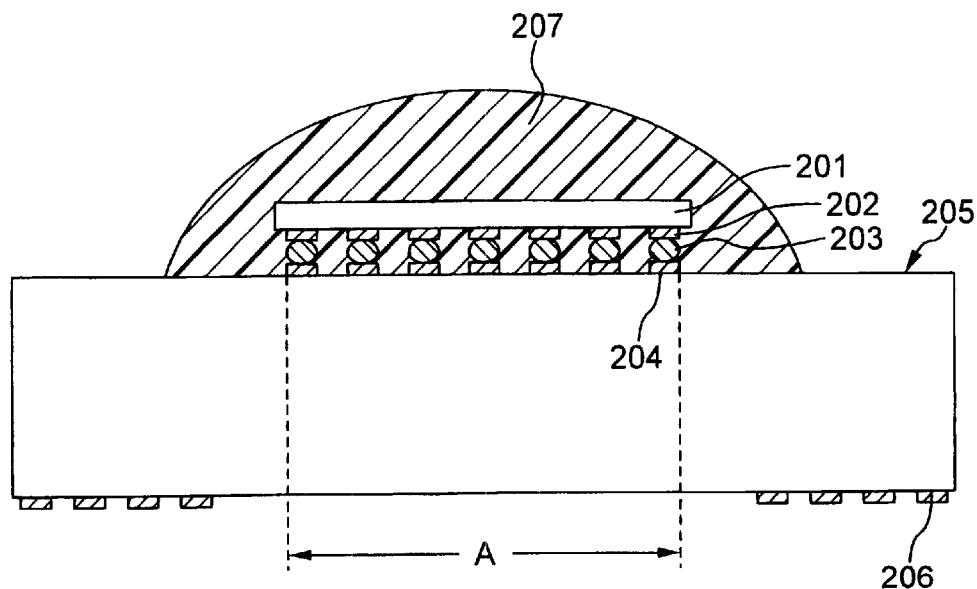
F I G. 17A
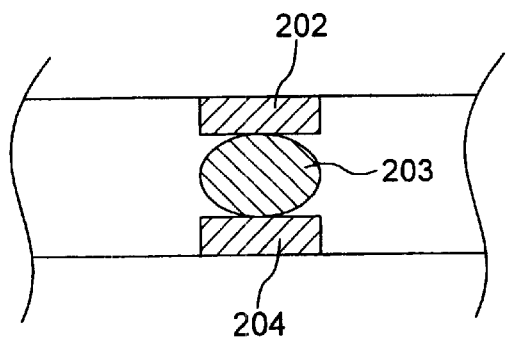
F I G. 17B
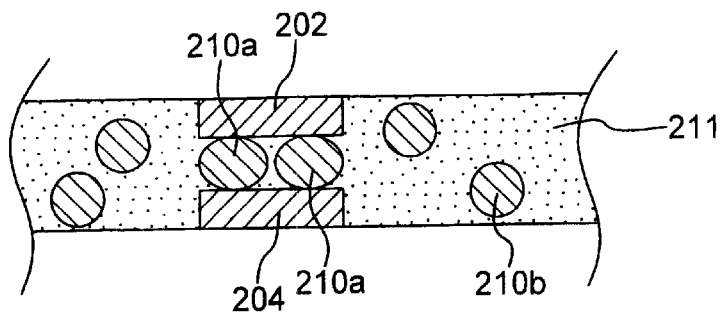
F I G. 17C

WIRING BOARD, SEMICONDUCTOR PACKAGE AND SEMICONDUCTOR DEVICE

BACKGROUND OF THE INVENTION

1. Field of the Invention

The present invention relates generally to a wiring board, a semiconductor package and a semiconductor device, which have two-dimensionally arranged input/output terminals.

2. Description of the Related Art

In recent years, in place of a semiconductor device having peripheral arrangement type input/output terminals, a semiconductor device having two-dimensionally arranged input/output terminals has been developed and put to practical use, in view of the mounting on a multi-pin semiconductor device, electric characteristics, miniaturization and densification. In general, the arrangement of the input/output terminals of such a semiconductor device is determined by the function of the semiconductor device itself, and takes no great account of the connecting wiring to another semiconductor device when the semiconductor device is mounted on a wiring board, or to the input/output part of the wiring board. Also in the wiring board, there is the lower limit to wiring and connecting terminal pitch, so that there is a problem in that required wiring can not be provided on the wiring board after mounting. This is no problem in a semiconductor device having a small number of input/output terminals, such as a memory. However, in a semiconductor device having a multi-pin input/output terminal, such as a data processing circuit or a logic circuit, there is a problem in that it is difficult to make a wiring layout on a wiring board side inside of an input/output arrangement, although a signal line arranged on the terminal in the peripheral portion of the input/output arrangement can be connected to the wiring on the wiring board.

In order to solve this problem, in a conventional semiconductor device 100, terminals 102 having alternating current stable potentials, such as a power supply or a ground, are concentrated on the central portion, and input/output terminals 104 for other signals are arranged on the peripheral portion, as shown in FIG. 16. However, in such a structure, signal wirings are closely arranged on a wiring board, so that there is a problem in that it is difficult to control crosstalk and electric characteristics on the wiring board. This becomes obvious as the processed signals accelerate. In particular, it is required to control a wiring on a wiring board, on which a semiconductor device having a system's base clock of 200 MHz or more is mounted, as a transmission line.

Thus, in conventional wiring boards or semiconductor devices, signal wirings are closely arranged, so that there is a problem in that crosstalk occurs between signals transmitted through signal wirings.

In order to prevent crosstalk from occurring, it has only to arrange power supply wirings or ground power supply wirings, which are alternating current stable, adjacent signal wirings. However, if the power supply or ground power supply wirings are arranged adjacent the signal wirings, there is a problem in that the size of the wiring board or semiconductor device increases.

SUMMARY OF THE INVENTION

It is therefore an object of the present invention to eliminate the aforementioned problems and to provide a wiring board, a semiconductor package and a semiconductor device, which can prevent the occurrence of crosstalk and the increase of the size even if signal wirings are closely arranged.

In order to accomplish the aforementioned and other objects, according to one aspect of the present invention, there is provided a wiring board having a plurality of wiring layers, wherein a plurality of signal wiring terminals and a plurality of power supply terminals are arranged on a principal plane of the wiring board, the plurality of signal wiring terminals or the plurality of power supply terminals being connected to any one layer of inner layers of the wiring layers, and wherein signal wiring terminals, which are connected to wirings formed on the same layer, among the plurality of signal wiring terminals are arranged so that at least one side of the inside and outside of a region, in which the signal wiring terminals connected to the wirings formed on the same layer are formed, is surrounded by the power supply terminals.

The power supply terminals may have ground power supply terminals and driving power supply terminals, and the power supply terminals surrounding the at least one side of the inside and outside of the region, in which the signal wiring terminals are formed, may be the ground power supply terminals or the driving power supply terminals.

The power supply terminals surrounding the at least one side of the inside and outside of the region, in which the signal wiring terminals are formed, are preferably connected to a common wiring formed on the same layer.

The number k of signal wiring terminals, which are arranged on a column extending from an edge of the wiring board toward a central portion of the wiring board, among the signal wiring terminals surrounded by the power supply terminals are preferably arranged so as to satisfy the following formula:

$$k \leq 1 + (P-A-S)/(S+W)$$

wherein a size of each of the signal wiring terminals is A, a pitch between the signal wiring terminals is P, a width of each of the wirings is W, and a minimum dimension of a space between adjacent two of the wirings is S.

The power supply terminals are preferably arranged in the central portion and the outermost portion of the wiring board.

According to another aspect of the present invention, there is provided a semiconductor package having a plurality of wiring layers, wherein a plurality of signal wiring terminals and a plurality of power supply terminals are arranged on a principal plane of the semiconductor package, the plurality of signal wiring terminals or the plurality of power supply terminals being connected to any one layer of inner layers of the wiring layers, and wherein signal wiring terminals, which are connected to wirings formed on the same layer, among the plurality of signal wiring terminals are arranged so that at least one side of the inside and outside of a region, in which the signal wiring terminals connected to the wirings formed on the same layer are formed, is surrounded by the power supply terminals.

The power supply terminals may have ground power supply terminals and driving power supply terminals, and the power supply terminals surrounding the at least one side of the inside and outside of the region, in which the signal wiring terminals are formed, may be the ground power supply terminals or the driving power supply terminals.

The power supply terminals surrounding the at least one side of the inside and outside of the region, in which the signal wiring terminals are formed, are preferably connected to a common wiring formed on the same layer.

The number k of signal wiring terminals, which are arranged on a column extending from an edge of the semiconductor package toward a central portion of the semiconductor package, among the signal wiring terminals surrounded by the power supply terminals are preferably arranged so as to satisfy the following formula:

$$k \leq 1 + (P - A - S)/(S + W)$$

wherein a size of each of the signal wiring terminals is A, a pitch between the signal wiring terminals is P, a width of each of the wirings is W, and a minimum dimension of a space between adjacent two of the wirings is S.

The power supply terminals are preferably arranged in the central portion and the outermost portion of the semiconductor package.

According to another aspect of the present invention, a semiconductor device comprises: a wiring board; a semiconductor package having terminals provided on the principal plane so as to correspond to terminals of the wiring board; and a semiconductor chip which is mounted on the semiconductor package and which is electrically connected to the semiconductor package, the terminals of the semiconductor package being connected to corresponding terminals of the wiring board.

According to a further aspect of the present invention, there is provided a wiring board having a plurality of signal wiring layers and a plurality of first and second power supply terminals, which are arranged on a principal plane of the wiring board, wherein at least one side of the inside and outside of a first region, in which the first power supply terminals are formed, is surrounded by the signal wiring terminals, and at least one side of the inside and outside of a second region, in which the second power supply terminals are formed, is surrounded by the signal wiring terminals.

The second region may be arranged within the first region, which may be spaced from the second region via a third region, and all of terminals arranged in the third region may be signal wiring terminals.

Preferably, the wiring board is a multilayer printed circuit board having wiring layers of inner layers, and all of terminals electrically connected to wiring layers of the inner layers among the terminals arranged in the third region are electrically connected to the same wiring layer.

According to a still further aspect of the present invention, there is a semiconductor package having a plurality of signal wiring layers and a plurality of first and second power supply terminals, which are arranged on a principal plane of the semiconductor package, wherein at least one side of the inside and outside of a first region, in which the first power supply terminals are formed, is surrounded by the signal wiring terminals, and at least one side of the inside and outside of a second region, in which the second power supply terminals are formed, is surrounded by the signal wiring terminals.

The second region may be arranged within the first region, which may be spaced from the second region via a third region, and all of terminals arranged in the third region may be signal wiring terminals.

Preferably, the semiconductor package has multilayer wiring layers as inner layers, and all of terminals electrically connected to wiring layers of the inner layers among the terminals arranged in the third region are electrically connected to the same wiring layer.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings:

FIG. 17A is a sectional view of a modified example of the first preferred embodiment of the present invention;

FIG. 17B is a sectional view showing an example of the connection of a semiconductor package to a semiconductor chip shown in FIG. 17A; and FIG. 17C is a sectional view of another example of the connection of a semiconductor package to a semiconductor chip shown in FIG. 17A.

DESCRIPTION OF THE PREFERRED EMBODIMENTS

Referring now to the accompanying drawings, the preferred embodiment of the present invention will be described below.

First Preferred Embodiment

Figure 1:
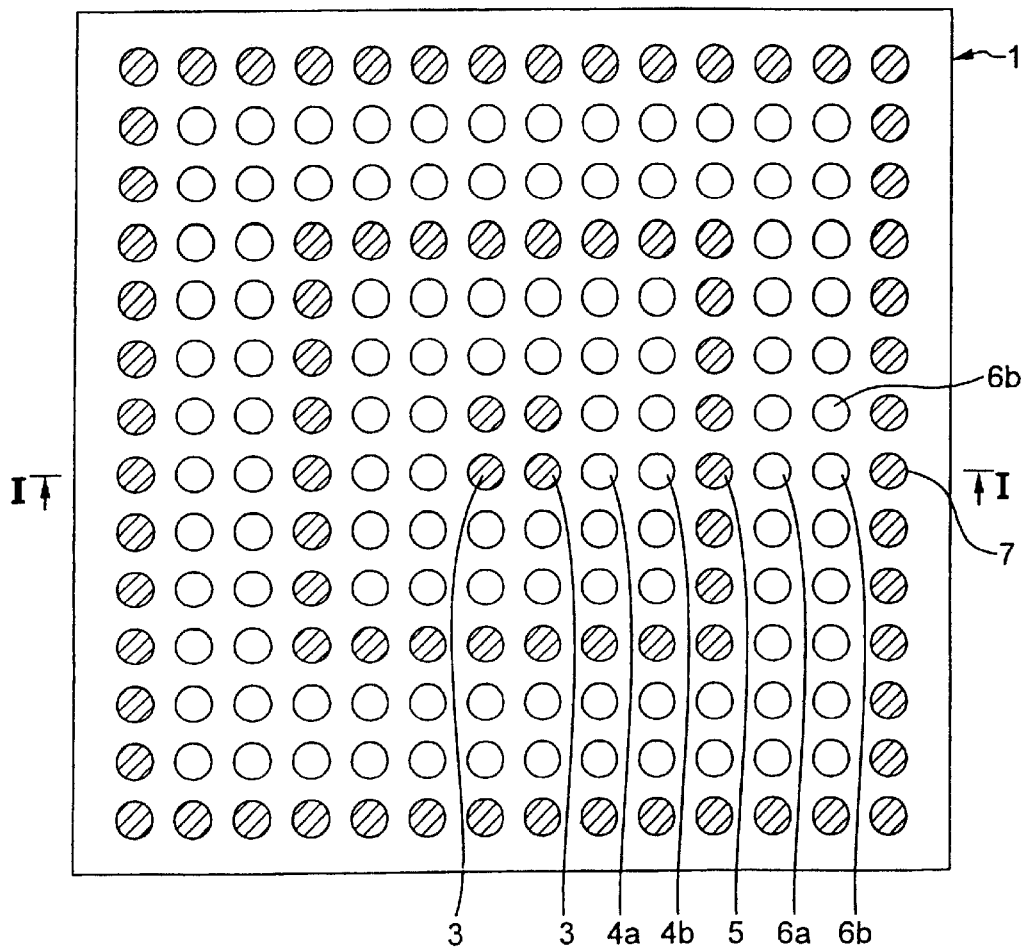
FIG. 1 is a plan view of the first preferred embodiment of the present invention.
Figure 2:
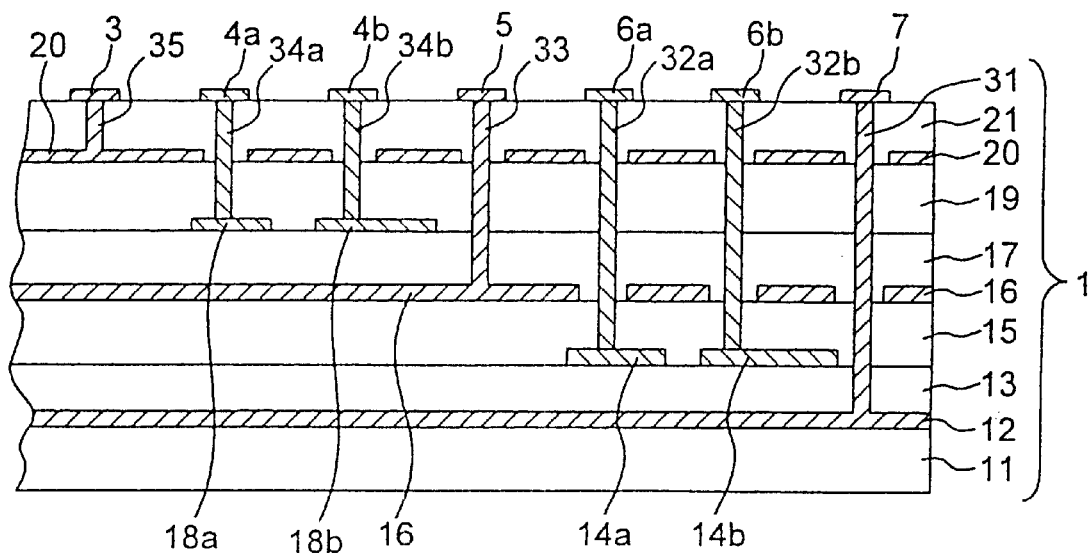
FIG. 2 is a sectional view taken along line I—I of FIG. 1.

The preferred embodiment of the present invention is shown in FIGS. 1 and 2. FIG. 1 is a plan view of the first preferred embodiment of a wiring board 1 according to the present invention, and FIG. 2 is a sectional view taken along line I—I of FIG. 1.

As shown in FIG. 2, the wiring board 1 in the first preferred embodiment is a multilayer printed circuit board which comprises: an insulating layer 11 having a conductive layer 12 formed on the principal plane thereof; an insulator film 13 which is stacked on the insulating layer 11 and which has wiring patterns 14a and 14b formed on the principal plane thereof; an insulating layer 15 which is stacked on the insulating layer 13 and which has a conductive layer 16 formed on the principal plane thereof; an insulating layer 17 which is stacked on the insulating layer 15 and which has wiring patterns 18a and 18b formed on the principal plane thereof; an insulating layer 19 which is stacked on the insulating layer 17 and which has a conductive layer 20 formed on the principal plane thereof; and an insulating board 21 which is stacked on the insulating layer 19 and which has a plurality of terminals 3, 4a, 4b, 5, 6a, 6b and 7 formed on the principal plane thereof. Furthermore, the terminals 3, 4a, 4b, 5, 6a, 6b and 7 are arranged in the form of a matrix as shown in FIG. 1.

The plurality of terminals 3 are arranged on the central portion of the wiring board 1. The plurality of terminals 4a are arranged so as to surround the outside of a region, in which the terminals 3 are formed, and the plurality of terminals 4b are arranged so as to surround the outside of a region, in which the plurality of terminals 4a are formed. In addition, the plurality of terminals 5 are arranged so as to surround the outside of a region, in which the terminals 4b are formed, and the plurality of terminals 6a are formed so as to surround the outside of a region, in which the terminals 5 are formed. Moreover, the plurality of terminals 6b are arranged so as to surround the outside of a region, in which the terminals 6a are formed. In addition, the plurality of terminals 7 are arranged so as to surround the outside of a region, in which the terminals 6b are formed.

The terminals 7 arranged in the outermost of the wiring board 1 are ground power supply or driving power supply terminals, and connected to the conductive layer 12 on the insulating layer 11 via contacts 31. The conductive layer 12 is preferably formed onto the principal plane of the insulating layer 11.

The terminals 6a and 6b are signal wiring terminals, and connected to the wiring patterns 14a and 14b on the insulating layer 13 via contacts 32a and 32b, respectively.

The terminals 5 are ground power supply or driving power supply terminals, and connected to the conductive layer 16 on the insulating layer 15 via contacts 33. Furthermore, the conductive layer 16 covers the insulating layer 15, except for portions surrounding the contacts 31, 32a and 32b so that the conductive layer 16 is not electrically connected to these contacts.

The terminals 4a and 4b are signal wiring terminals, and connected to the wiring patterns 18a and 18b on the insulating layer 17 via contacts 34a and 34b, respectively.

The terminals 3 are ground power supply or driving power supply terminals, and connected to the conductive layer 20 on the insulating layer 19 via a contact 35. Furthermore, the conductive layer 20 covers the insulating layer 19, except for portions surrounding the contacts 31, 32a, 32b, 33, 34a and 34b so that the conductive layer 20 is not electrically connected to these contacts.

As can be seen from the foregoing, in the wiring board 1 in this preferred embodiment, the signal wiring terminals connected to the wiring patterned provided on the same layer are arranged so that the inside or outside of the region, in which the signal wiring terminals are formed, is surrounded by the alternating current stable ground power supply or driving power supply terminals. For example, the signal wiring terminals 6a and 6b connected to the wiring layers 14a and 14b provided on the insulating layer 13 are arranged so that the inside and outside of a region, in which these terminals are formed, are surrounded by the ground power supply or driving power supply terminals 5 and 7, and the signal wiring terminals 4a and 4b connected to the wiring patterns 18a and 18b provided on the insulating layer 17 are arranged so that the inside and outside of a region, in which these terminals are formed, are surrounded by the ground power supply or driving power supply terminals 3 and 5.

By such an arrangement of signal wiring terminals, the signal wirings (wiring patterns) provided on different layers are shielded by the alternating current stable conductive layer for connecting power supply or driving power supply, so that it is possible to prevent crosstalk from occurring. In addition, since it is not required to provide any alternating current stable ground power supply or driving power supply wirings adjacent signal wirings on the same layer, it is possible to prevent the size of a wiring board or semiconductor device from increasing.

Figure 3:
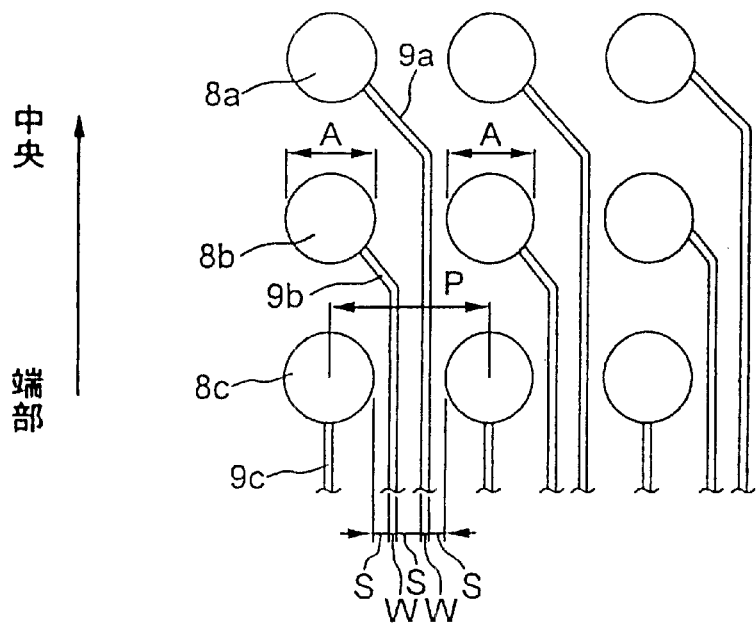
FIG. 3 is a schematic view for explaining the relationship between the wiring width, the distance between pads and the number of wirings.

In this preferred embodiment, among the wiring terminals surrounded by the ground power supply or driving power supply terminals, the number of the wiring terminals arranged so as to extends from the edge toward the central portion is 2. The number of the wiring terminals is determined by the size A of a pad, the pitch P between pads, the wiring width W of a wiring pattern, and the minimum dimension S of the pattern (a value determined by a design rule). Referring to FIG. 3, this will be described below. FIG. 3 is a schematic diagram showing a wiring pattern formed on the same layer. Furthermore, in FIG. 3, the minimum size S is the minimum size of a space between wirings.

In FIG. 3, pads 8a, 8b and 8c are connected to terminals (e.g., terminals 6a and 6b shown in FIG. 2), which are formed on the uppermost layer of the wiring board, via contacts. The pads 8a, 8b and 8c are arranged in that order from the edge toward the central portion. A wiring 9a extends from the pad 8a toward the edge, and a wiring 9b extends from the pad 8b toward the edge. Thus, the wirings 9a and 9b pass through spaces between the pads 8c on the edge side.

Therefore, the wirings, which are connected to the pads (e.g., pads 8a, 8b) other than the outermost pads (e.g., pads 8c) of the pads connected to the signal wiring terminals surrounded by the ground power supply or driving power supply terminals, pass through the adjacent two of the outermost pads. Thus, assuming that the number of signal wiring terminals, which are arranged so as to extend from the edge toward the central portion, among the signal wiring terminals surrounded by the ground power supply or driving power supply terminals is k, (k−1) wirings 9a and 9b pass through spaces between adjacent two of the outermost pads 8c as shown in FIG. 3, so that it is required to satisfy the following inequality.

$$(S+W)(k-1)+S \leq P-A$$

That is:

$$k \leq 1+(P-A-S)/(S+W)$$

Furthermore, k=3 in FIG. 3.

If signal wiring terminals, the number of which satisfies the above inequality, are arranged from the edge toward the central portion, the wiring board in the first preferred embodiment can be realized.

According to the wiring board in the first preferred embodiment, as shown in FIG. 2, e.g., the signal wiring patterns 14a and 14b are arranged adjacent the ground power supply or driving power supply wirings 12 and 16 via the insulating layers 13 and 15. The ground power supply or driving power supply wirings 12 and 16 are connected to the terminals 5 and 7 on the principal plane of the wiring board. This connection is carried out at the 5 shortest distance by means of the contacts (contact plugs) 31 and 33.

With such a construction, if a system having a base clock of 100 MHz or more, particularly a base clock of 200 MHz, is used, the wiring board in the above preferred embodiment has conspicuous effects.

These effects will be described below. Considering return currents and noises assuming that the clock frequency is 200 MHz. If the rise/fall time is 10% as large as the clock cycle, the rise time is 500 psec when the clock frequency is 200 MHz. The propagating distance of a signal during this period of 500 psec is about 30 cm (assuming that the relative dielectric constant is 4). That is, taking account of the round trip of the signal due to reflection or the like, the above described distance can not be ignored as a distributed constant line in a package board (wiring board). In general, when the frequency exceeds about 100 MHz, it is considered that a matching resistance (terminating resistance) can be provided to cope with the above described problem. However, when the frequency exceeds 200 MHz, it is not possible to transmit a signal containing a higher harmonic component unless the structure and construction of branching and a signal transmission path itself are strictly analyzed.

On the other hand, in a design for a rapid digital system, there are some cases where noises generate to inhibit the system from operating unless the return current flowing through a ground power supply layer is surely processed. In order to reduce undesired radiation, ground bounce, crosstalk noises and transmission characteristic deterioration of the signal, it is important to ensure the path for the return current. If the return current path is obstructed, there are troubles as follows.
(1) Noises increase by reflection due to impedance mismatching.
(2) The loop area formed by the return current path and signal line of the ground layer increases, so that the undesired radiation increases (signal energy loss is caused).
(3) Crosstalk noises to adjacent signal lines increase.
(4) The transmission frequency characteristic deteriorates (the higher harmonic component can not pass therethrough to deform the signal waveform.

The return current flows so as to minimize inductance. That is, currents flow while selecting a path having the minimum loop inductance formed by the going and returning currents (the current density is high). Therefore, if the ground power supply terminals and so forth are open ends, the contribution of these portions to the ground power supply (with respect to the return current) decreases.

Although the above described problems are particularly conspicuous at a frequency of higher than 200 MHz, the problems may be caused at a frequency of higher than 100 MHz.

According to this preferred embodiment, the ground power supply layer can be arranged adjacent the signal lines as described above, and the ground power supply layer can be connected to the outside ground power supply at the minimum distance. Therefore, if the wiring board in this preferred embodiment is used for a device using a clock of 200 MHz or higher, it is possible to realize a device which can inhibit the generation of noises and which can decrease undesired radiation, crosstalk noises and signal waveform deterioration.

Furthermore, while the wiring board has been described as an example in the above described preferred embodiment, the same effects can be obtained by a semiconductor package which has a multilayer intersection layer as shown in FIG. 17A as a modified example of the first preferred embodiment and wherein the mounting surface for a semiconductor chip has the same terminal arrangement as that shown in FIG. 1.

Referring to FIGS. 17A through 17C, the above described modified example will be described below.

In this modified example, the terminal arrangement of the wiring board described in the first preferred embodiment is applied to a semiconductor package. FIG. 17A is a sectional view of the semiconductor package in this modified example. Terminals 204 are arranged in the central portion on the surface of a semiconductor package body 205 (on the mounting surface for a semiconductor chip). Although seven terminals 204 are shown in FIG. 17A as an example, the number of the terminals 204 may be larger. Although the dimension of each of the signal wiring terminals and power supply terminals of the semiconductor package 205 is different from that of the wiring board shown in FIG. 1, the terminal arrangement thereof is the same as that shown in FIG. 1. The terminals 204 are electrically connected to electrodes 202 of a semiconductor chip 201 via solder bumps 203. Since the function of the electrodes 202 must correspond to the function of the terminals 204, the arrangement of the electrodes 202 are the same as the arrangement shown in FIG. 1. In addition, the whole surface of the semiconductor chip 201 is sealed with a sealing resin 207.

On the other hand, the terminals 204 on the surface of the semiconductor package body 205 are exposed to the reverse surface of the semiconductor package 205 via the internal wirings of the semiconductor package body 205 as reverse terminals 206. As the first preferred embodiment has been described referring to FIG. 3, if wirings are drawn out of the terminal portions (corresponding to 8c in FIG. 3), the wirable region extends in the outside. Therefore, in this modified example, if the reverse terminals 206 of the semiconductor package body 205 are formed outside of a portion (a portion shown by "A" in the figure) corresponding to the region for forming the surface terminals 204 as shown in FIG. 17A, it is easy to arrange the reverse terminals 206.

Furthermore, FIG. 17B shows an enlarged cross section of a portion in the vicinity of the terminal 202, the bump 203 and the terminal 204. As the number of the terminals increases, the variation in height of the bumps 203 between the terminals increases, so that it is difficult to form uniform electric connections using the bumps 203. In such a case, as shown in FIG. 17C, it is desired to connect the terminals to each other by means of asymmetric conductive paste (ACP). Since conductive fine particles 210 disperse in an insulating resin 211, only the terminals 202 and 204 having a small space therebetween are electrically connected to each other by means of conductive fine particles 210a. However, conductive fine particles 210b in a large space between the semiconductor chip 201 and the semiconductor package 205 do not contribute to electric connection, so that insulation can be maintained while the resin can be filled in the space between the semiconductor chip 201 and the semiconductor package 205. Thereafter, the whole space between the semiconductor chip 201 and the semiconductor package 205 may be sealed with the sealing resin 207. With such a construction, the semiconductor package 205 can also obtain the same effect as that in the first preferred embodiment.

(Second Preferred Embodiment)

Figure 4:
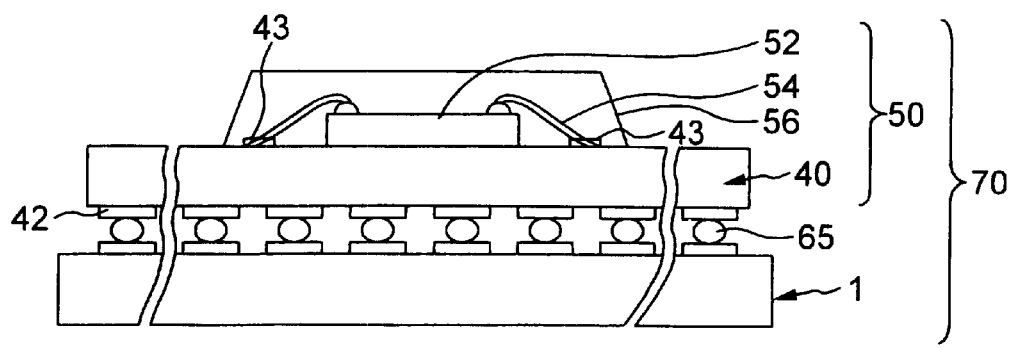
FIG. 4 is a sectional view of the second preferred embodiment of the present invention.
Figure 5:
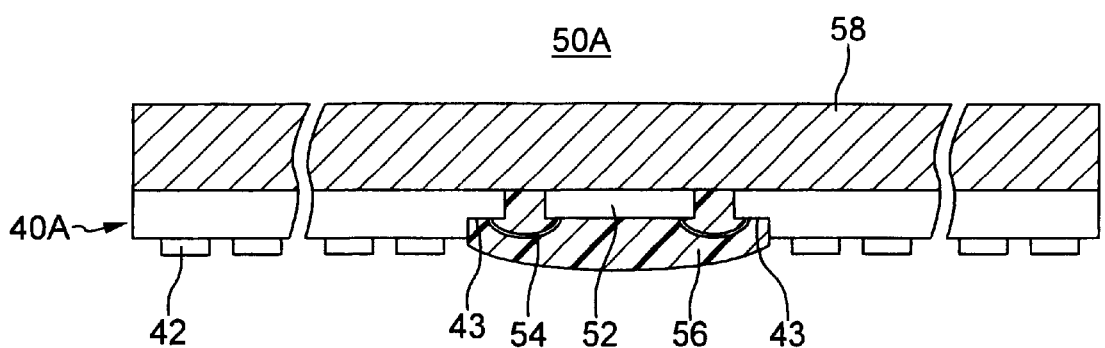
FIG. 5 is a sectional view of another example of a semiconductor device according to the present invention.

Referring to FIG. 4, the second preferred embodiment of the present invention will be described below.

In this preferred embodiment, a semiconductor mounting system 70 comprises a wiring board 1 and a semiconductor device 50. The wiring board 1 has the same construction as that in the first preferred embodiment shown in FIGS. 1 and 2. The semiconductor device 50 has a semiconductor package 40 and a semiconductor chip 52. Terminals 42 are formed on the principal plane of the semiconductor package 40 so as to correspond to terminals formed on the principal plane of the wiring board 1. The semiconductor chip 52 is mounted on the reverse surface of the semiconductor package 40. A plurality of terminals (pads) 43 are provided around a region, on which the semiconductor chip 52 is mounted. These terminals 43 are electrically connected to the semiconductor chip 52 by, e.g., wires 54, and electrically connected to the terminals 42 provided on the principal surface. The semiconductor chip 52 and the wires 54 are sealed with a resin or metal cap 56.

The terminals 42 provided on the principal plane of the semiconductor package 40 are connected to corresponding terminals of the wiring board 1 via bumps 65.

Furthermore, the semiconductor package 40 has substantially the same construction as that of the wiring board 1, except that terminals are provided on the reverse surface thereof. That is, the semiconductor package 40 is a multi-layer printed circuit board, on which terminals are also formed on the reverse surface thereof, and the signal wiring terminals provided on the principal plane connected to the wiring patterns provided on the same layer are arranged so that the inside and outside of a region, in which the signal wiring terminals are formed, are surrounded by the alternating current stable ground power supply or driving power supply terminals.

With this construction, the semiconductor package 40 and the semiconductor device 50 can prevent crosstalk from occurring even if the signal wirings are closely arranged, so that it is possible to prevent the size from increasing.

Furthermore, while the semiconductor device 50 in the second preferred embodiment has had the semiconductor package 40 having the semiconductor chip mounted on the reverse surface thereof, a semiconductor device 50A may have a semiconductor package 40A, on the principal plane of which terminals 42 to be connected to the wiring board 1, and the semiconductor chip 52 are mounted. In this case, a heat sink 58 is provided on the reverse surface of the semiconductor package 40A.

Figure 6:
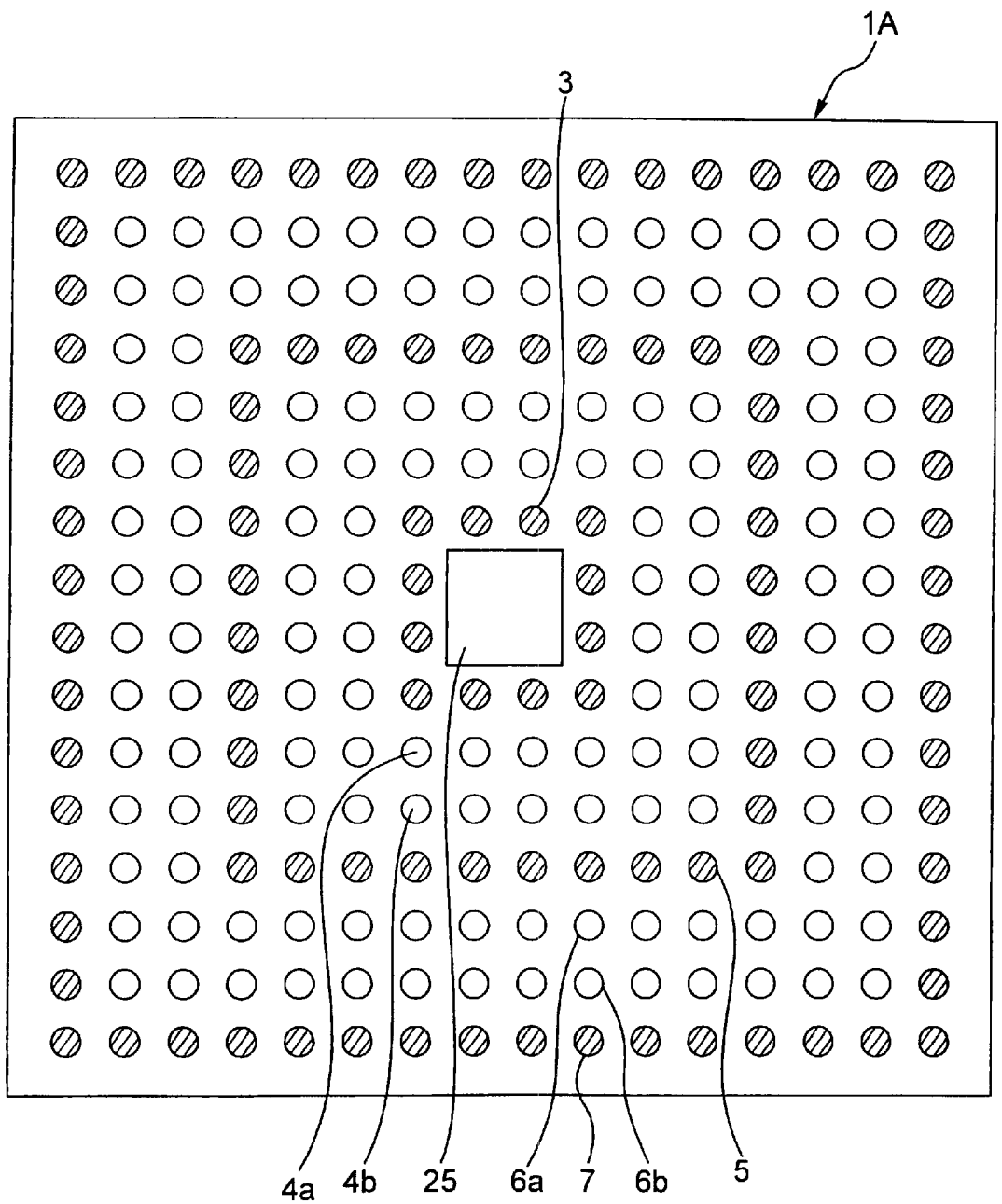
FIG. 6 is a plan view of a wiring board which is combined with the semiconductor device shown in FIG. 5.

The wiring board combined with the semiconductor device 50A is a wiring board 1A shown in FIG. 6. That is, a cavity 25 for housing therein the sealed semiconductor chip 52 is formed in the central portion, and connecting power supply and driving power supply terminals 3 are arranged around the cavity 25. Outside of the region, in which the terminals 3 are formed, signal wiring terminals 4a and 4b to be connected to wiring patterns provided on the same layer are arranged. In addition, ground power supply or driving power supply terminals 5 are arranged so as to surround the outside of the region, in which the terminals 4a and 4b are formed. Outside of the region, in which the terminals 5 are formed, signal wiring terminals 6a and 6b to be connected to wiring patterns provided on the same layer are arranged. Moreover, ground power supply or driving power supply terminals 7 are arranged so as to surround the outside of the region, in which the terminals 6a and 6b are provided.

With this construction, according to the wiring board 1A, the semiconductor package 40A and the semiconductor device 10, even if the signal wirings are closely arranged, it is possible to prevent crosstalk from occurring, and it is possible to prevent the size from increasing.

Figure 7:
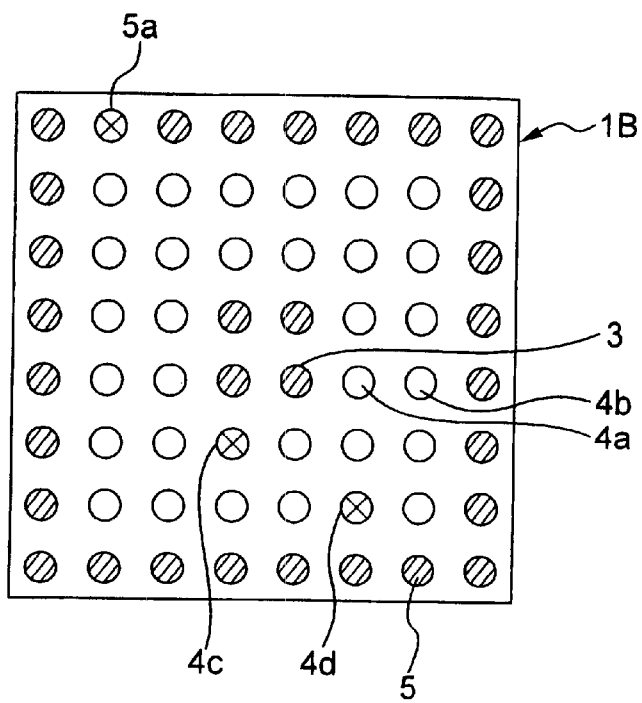
FIG. 7 is a plan view of a first modified example of a wiring board according to the present invention.

Furthermore, while all of the signal wiring terminals or power supply terminals provided on the principal plane have been connected to the underlying wiring pattern or conductive layer in the above described preferred embodiment, a wiring board 1B may be formed so as to have terminals 4c and 4d, which are not connected to the underlying wiring pattern, and a terminal 5a, which is not connected to the conductive layer, as shown in FIG. 7.

Figure 8:
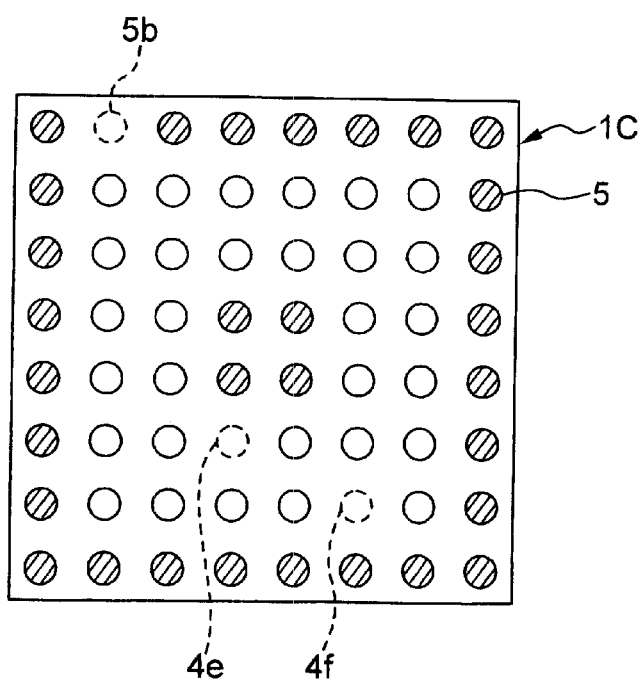
FIG. 8 is a plan view of a second modified example of a wiring board according to the present invention.

Alternatively, as shown in FIG. 8, a wiring board 1C may be formed so as not to form terminals (shown by 5b, 4e, 4f in FIG. 7), which are not connected to the underlying pattern or conductive layer.

Figure 9A:
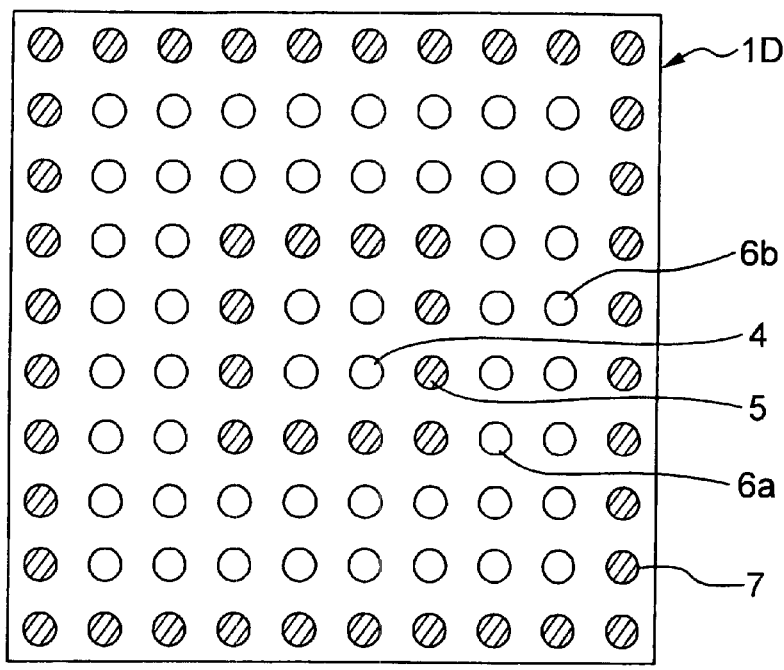
FIG. 9A is a plan view of another modified example of a wiring board according to the present invention.

In addition, while the wiring board in the above described preferred embodiment has been provided with the ground power supply or driving power supply terminals in the central portion, a wiring board 1D may be provided as shown in FIG. 9A. In this wiring board 1D, signal wiring terminals 4 to be connected to signal wiring patterns formed on the same layer are provided in the central portion. In addition, ground power supply or driving power supply terminals 5 are arranged so as to surround the outside of the region, in which the terminals 4 are formed. In addition, signal wiring terminals 6a and 6b to be connected to signal wiring patterns formed on the same layer are arranged so as to surround the outside of the region, in which the terminals 5 are formed. Moreover, ground power supply or driving power supply terminals 7 are provided so as to surround the outside of the region, in which the terminals 6a and 6b are formed.

Figure 9B:
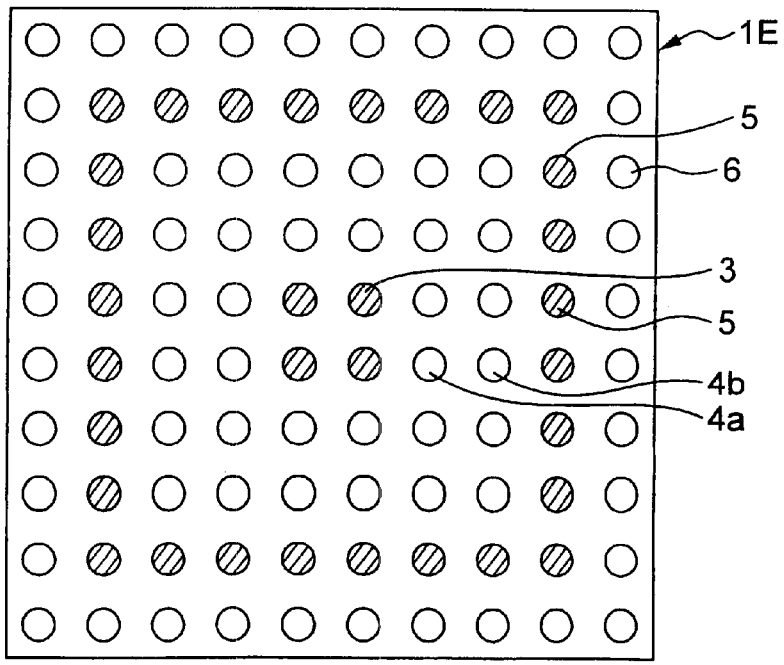
FIG. 9B is a plan view of another modified example of a wiring board according to the present invention.

Alternatively, as shown in FIG. 9B, a wiring board 1E may be formed so that the outermost terminals are signal wiring terminals 6. Also in this case, the inside or outside of a region, in which the signal wiring terminals 6 are formed, is surrounded by ground power supply or driving power supply terminals 5.

The semiconductor package in this preferred embodiment can obtain the same effects as those in the above described first preferred embodiment.

Furthermore, in each of the above described first and second preferred embodiments, only the cross section of the inner layers (the layers, on which the wiring patterns or conductive layers are formed) of the plurality of wiring layers of the wiring board and semiconductor package has been shown. In both of the preferred embodiments, it is designed that the wiring layer serving as the ground power supply layer or driving power supply layer of the inner layers has a wider conductive layer formed in at least a region corresponding to the portion of the wiring pattern of the adjacent signal wiring layer via the insulating layer.

Referring to FIGS. 10 through 14, the third preferred embodiment of a method for producing the first preferred embodiment of a wiring board according to the present invention will be described below.

First, as shown in FIG. 10(*a*), a conductive layer 12 of a copper foil having a thickness of, e.g., 35 $\mu$m, is bonded to the upper surface of an insulating layer 11 of a thermosetting resin (e.g., epoxy resin), and then, heat hardening is carried out.

Figure 10A:
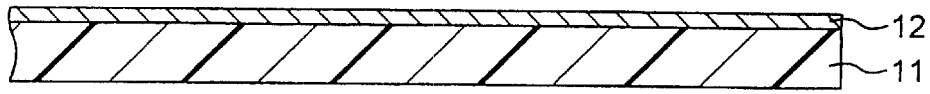
FIGS. 10(a), 10(b), 10(c), and 10(d) are sectional views showing a production process in the third preferred embodiment of the present invention; producing process in the third preferred embodiment of the present FIGS. 11(a, 11(b), and 11(c) are sectional views showing a production process in the third preferred embodiment of the present invention.
Figure 10B:
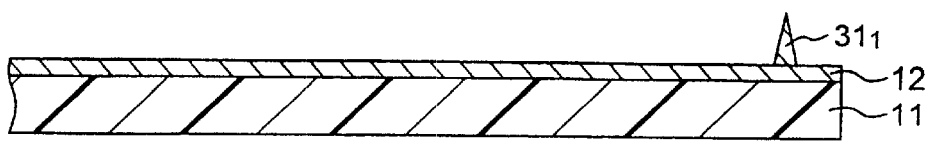
Figure 10C:
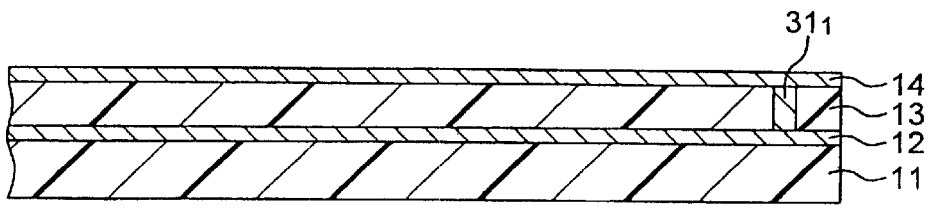

Subsequently, as shown in FIG. 10(b), a conductive bump $31_1$ is formed on the conductive layer 12 at a predetermined position. Thereafter, as shown in FIG. 10(c), an insulating layer 13 of a thermosetting resin is stacked thereon, and heat hardening is carried out which pressurization is carried out. Then, the conductive bump $31_1$ passes through the insulating layer 13, and the insulating layer 13 is hardened.

Subsequently, a conductive layer 14 of a copper foil having a thickness of, e.g., 35 μm, , is bonded to the upper surface of the hardened insulating layer 13 (see FIG. 10(c)).

Figure 10D:
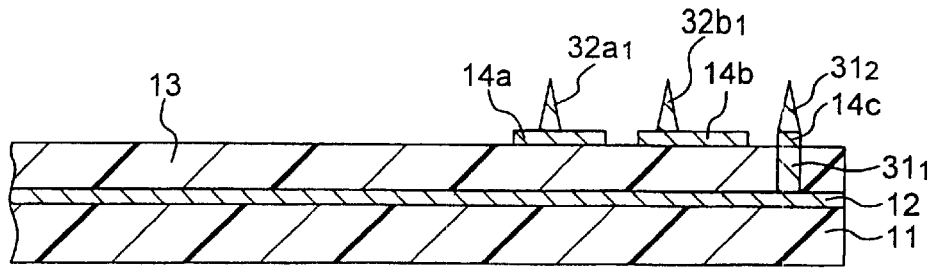

Then, as shown in FIG. 10(d), the conductive layer 14 is patterned by the photolithography technique to form wiring patterns 14a and 14b and a pad 14c. Furthermore, the pad 14c is formed on the conductive bump $31_1$ Subsequently, conductive bumps $32a_1$, $32b_1$, and $31_2$ are formed on the wiring patterns 14a and 14b at predetermined positions and on the pad 14c, respectively (see FIG. 10(d)).

Figure 11A:
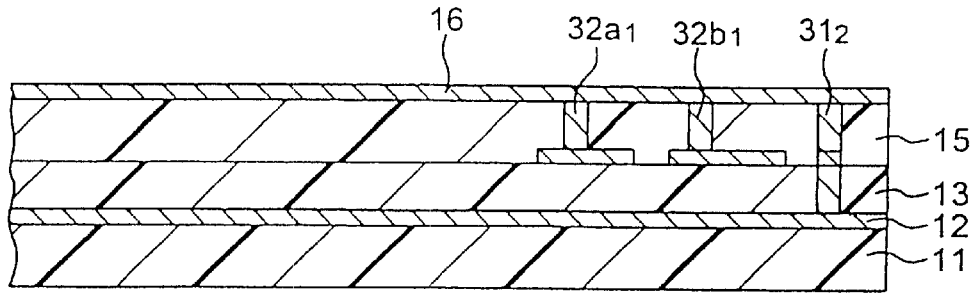

Then, as shown in FIG. 11(a), an insulating layer 15 of a thermosetting resin is stacked thereon, and heat hardening is carried out while pressurization is carried out. Then, the conductive bumps $32a_1$, $32b_1$, and $31_2$ pass through the insulating layer 15, and the insulating layer 15 is hardened. Subsequently, a conductive layer 16 of a copper foil having a thickness of, e.g., 35 μm, is bonded to the upper surface of the insulating layer 15 (see FIG. 11(a)).

Figure 11B:
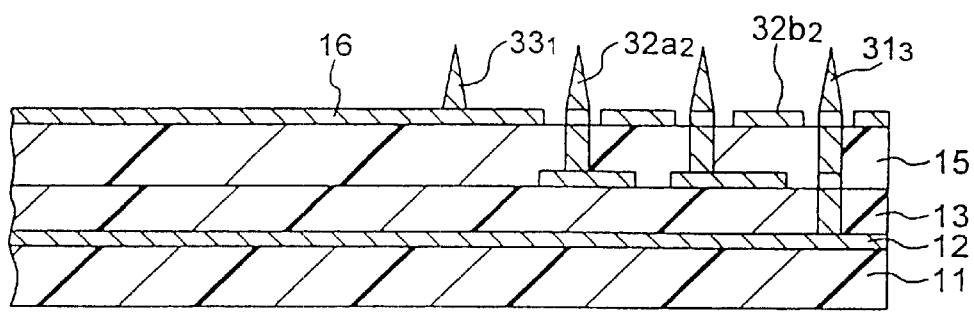

Then, as shown in FIG. 11(b), the conductive layer 16 is patterned. In this patterning, portions of the conductive layer 16 surrounding the conductive the conductive bumps $32a_1$, $32b_1$ and $31_2$ are removed, and pads are formed on the conductive bumps $32a_1$, $32b_1$, and $31_2$ so that the conductive layer 16 is not electrically connected to the conductive bumps $32a_1$, $32b_1$, and $31_2$. Subsequently, conductive bumps $33_1$, $32a_2$, $32b_2$ and $31_3$ are formed on the conductive layer 16 at a predetermined position and on the pads of the conductive bumps $32a_1$, $32b_1$ and $31_2$, respectively (see FIG. 11(b)).

Figure 11C:
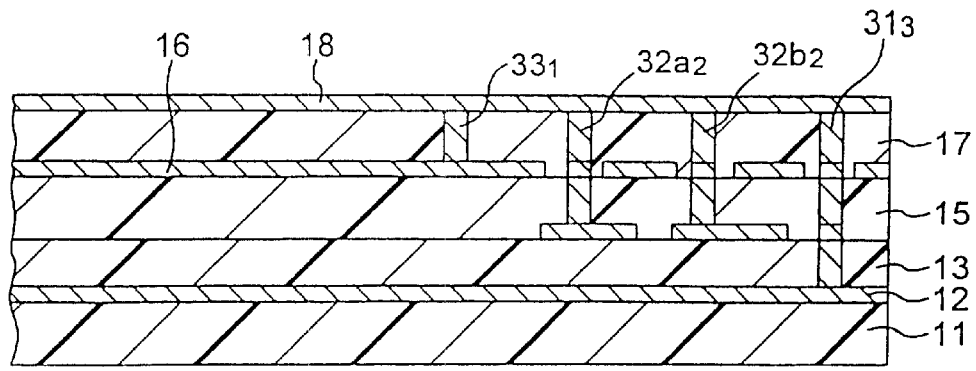

Then, as shown in FIG. 11(c), an insulating layer 17 of a thermosetting resin is stacked thereon, and heat hardening is carried out while pressurization is carried out. Then, the conductive bumps $33_1$, $32a_2$, $32b_2$ and $31_3$ pass through the insulating layer 17, and the insulating layer 17 is hardened. Subsequently, a conductive layer 18 of a copper foil having a thickness of, e.g., 35 μm, is bonded to the upper surface of the insulating layer 17 (see FIG. 11(c)).

Figure 12A:
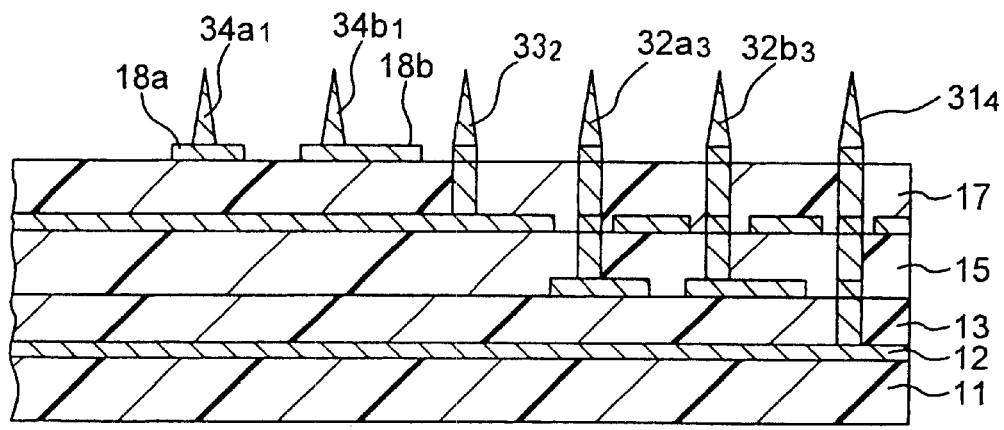
FIGS. 12(aand 12(b) are sectional views showing a production process in the third preferred embodiment of the present invention.

Then, as shown in FIG. 12(a, the conductive layer 18 is patterned to form wiring patterns 18a and 18b, and pads on the conductive bumps $33_1$, $32a_2$, $32b_2$ and $31_3$. Subsequently, conductive bumps $34a_1$, $34b_1$, $33_2$, $32a_3$, $32b_3$ and $31_4$ are formed on the wiring patterns 18a and 18b at predetermined positions and on the pads, respectively (see FIG. 12(a)).

Figure 12B:
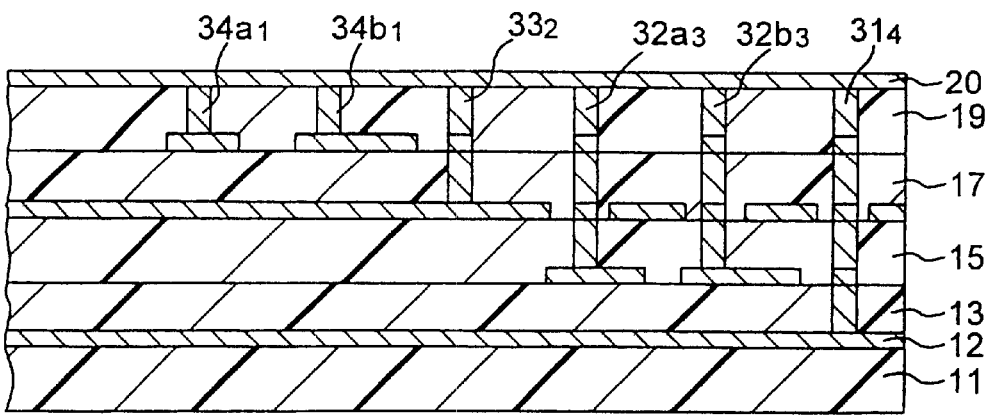

Then as shown in FIG. 12(b), after an insulating layer 19 of a thermosetting resin is stacked thereon, heat hardening is carried out while pressurization is carried out. Then, the conductive bumps $34a_1$, $34b_1$, $33_2$, $32a_3$, $32b_3$ and $31_4$ pass through the insulating layer 19, and the insulating layer 19 is hardened. Subsequently, a conductive layer 20 of a copper foil having a thickness of, e.g., 35 μm, is bonded to the upper surface of the insulating layer 19 (see FIG. 12(b)).

Figure 13A:
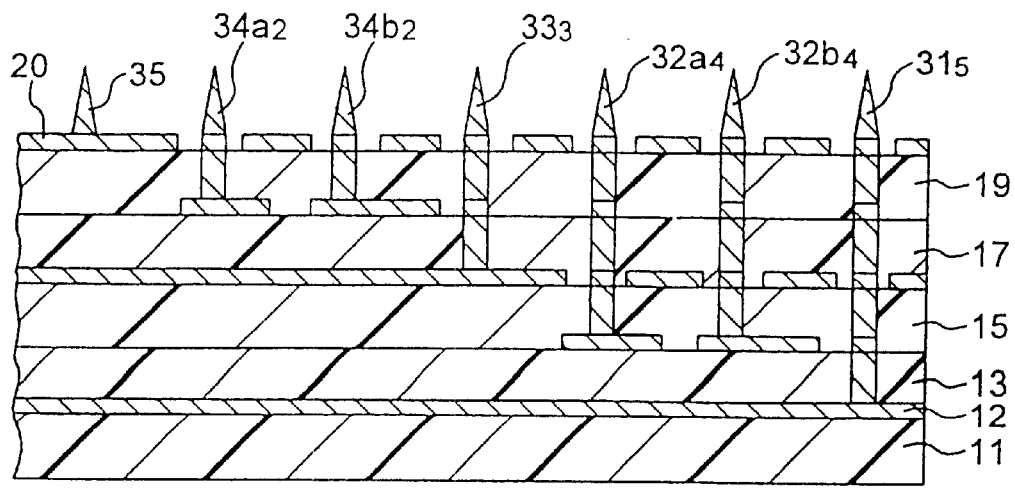
FIGS. 13(aand 13(b) are sectional views showing a production process in the third preferred embodiment of the present invention.

Then, as shown in FIG. 13(a, after the conductive layer 20 is patterned, conductive bumps 35, $34a_2$, $34b_2$, $33_3$, $32a_4$, $32b_4$ and $31_5$ are formed at predetermined positions.

Figure 13B:
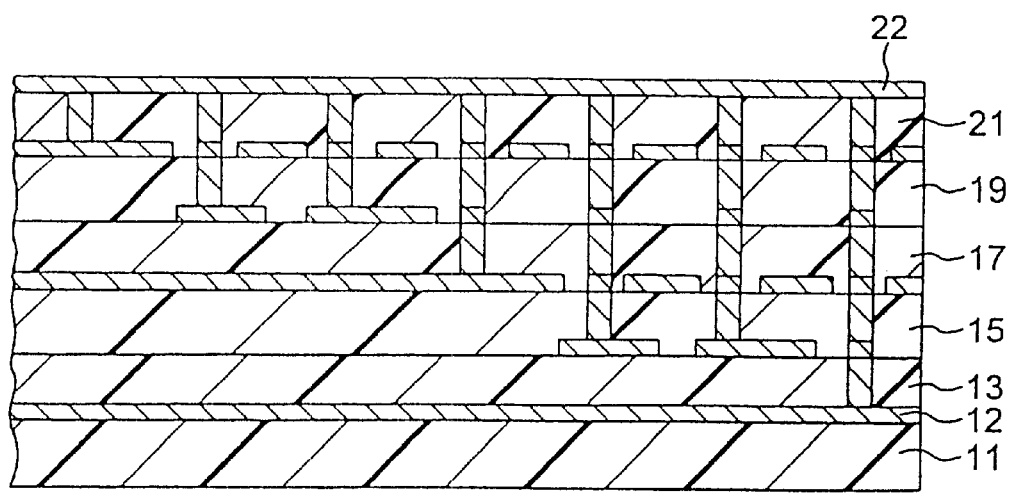

Then, as shown in FIG. 13(b), after an insulating layer 21 of a thermosetting resin is stacked, heat hardening is carried out while pressurization is carried out. Then, the conductive bumps 35, $34a_2$, $34b_2$, $33_3$, $32a_4$, $32b_4$ and $31_5$ pass through the insulating layer 21, and the insulating layer 21 is hardened. Subsequently, a conductive layer 22 of a copper foil having a thickness of, e.g., 35 μm, is bonded to the upper surface of the insulating layer 21.

Figure 14:
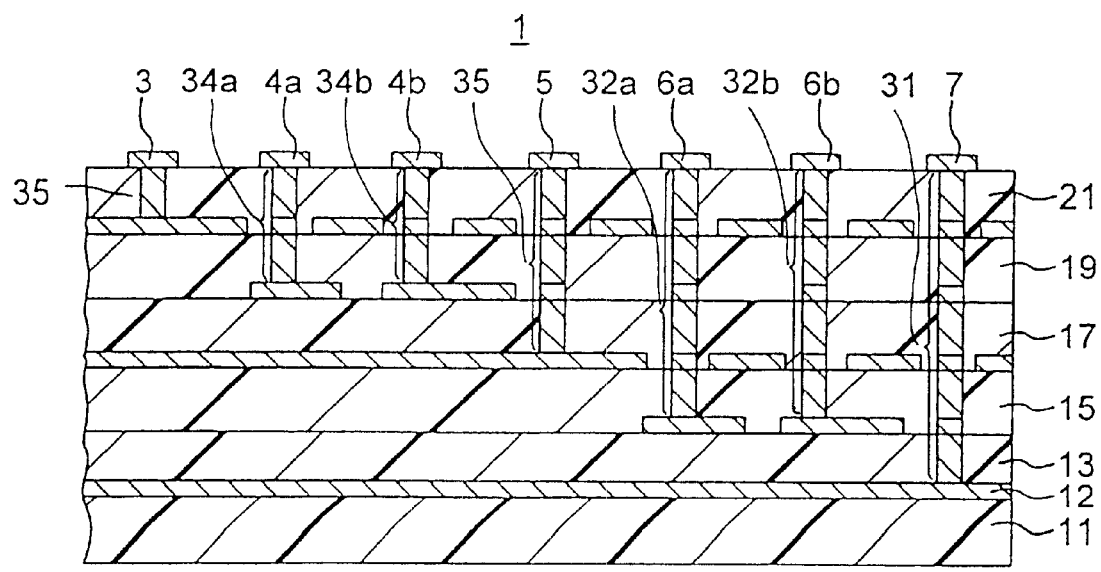
FIG. 14 is a sectional view showing a production process in the third preferred embodiment of the present invention.

Then, as shown in FIG. 14, the conductive layer 22 is patterned to form terminals 3, 4a, 4b, 5, 6a, 6b, and 7 to complete a wiring board 1. Furthermore, the conductive bumps $31_1$, $31_2$, $31_3$, $31_4$ and $31_5$ serve as a contact 31, the conductive bumps $32a_1$, $32a_2$, $32a_3$ and $32a_4$ serve as a contact 32a, and the conductive bumps $32b_1$, $32b_2$, $32b_3$ and $32b_4$ serve as a contact 32b. In addition, the conductive bumps $33_1$, $33_2$ and $33_3$ serve as a contact 33, the conductive bumps $34a_1$ and $34a_2$ serve as a contact 34a, and the conductive bumps $34b_1$ and $34b_2$ serve as a contact 34b. Moreover, the conductive bump 35 serves as a contact 35.

Furthermore, while the terminals have been formed on only one side in the method for producing the wiring board in the above described preferred embodiment, a method for producing a semiconductor package 40 shown in FIG. 4, which have terminals on both sides, will be described referring to FIG. 15.

Figure 15A:
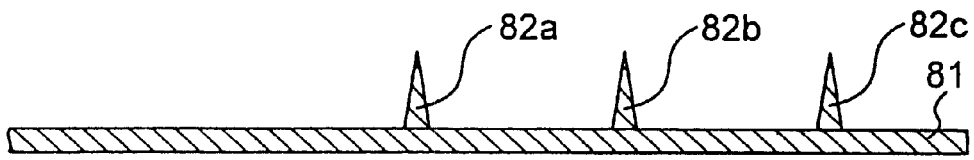
FIGS. 15(a), 15(b), and 15(c) are sectional views of a wiring board or semiconductor package having terminals on both sides thereof according to the present invention.

First, as shown in FIG. 15(a), conductive bumps 82a, 82b and 82c are formed on a conductive layer 81 of a copper foil. Subsequently, after an insulating layer 80 of a thermosetting resin is stacked thereon, heat hardening is carried out while pressurization is carried out (see FIG. 15(b)). Then, the conductive bumps 82a, 82b and 82c pass through the insulating layer 80, and the insulating layer 80 is heat hardened.

Figure 15B:
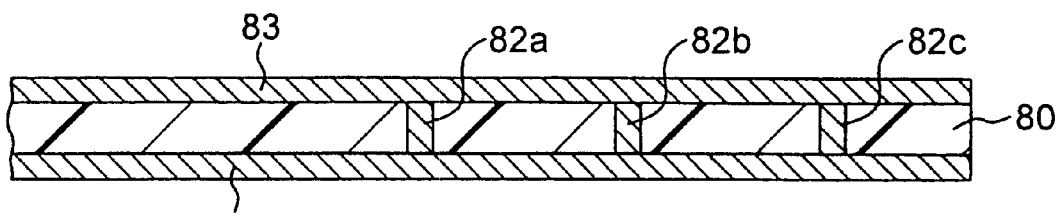
Figure 15C:
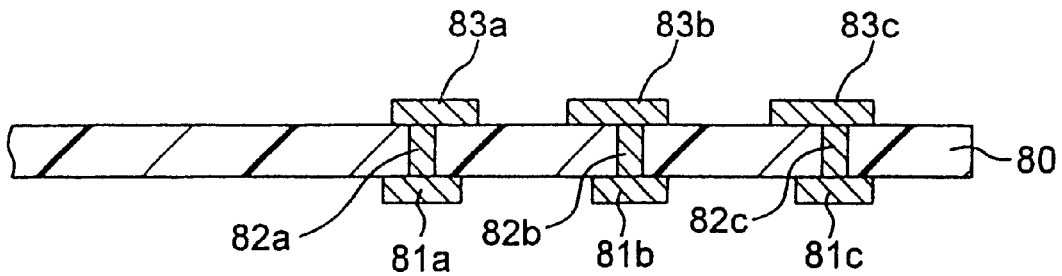
Figure 16:
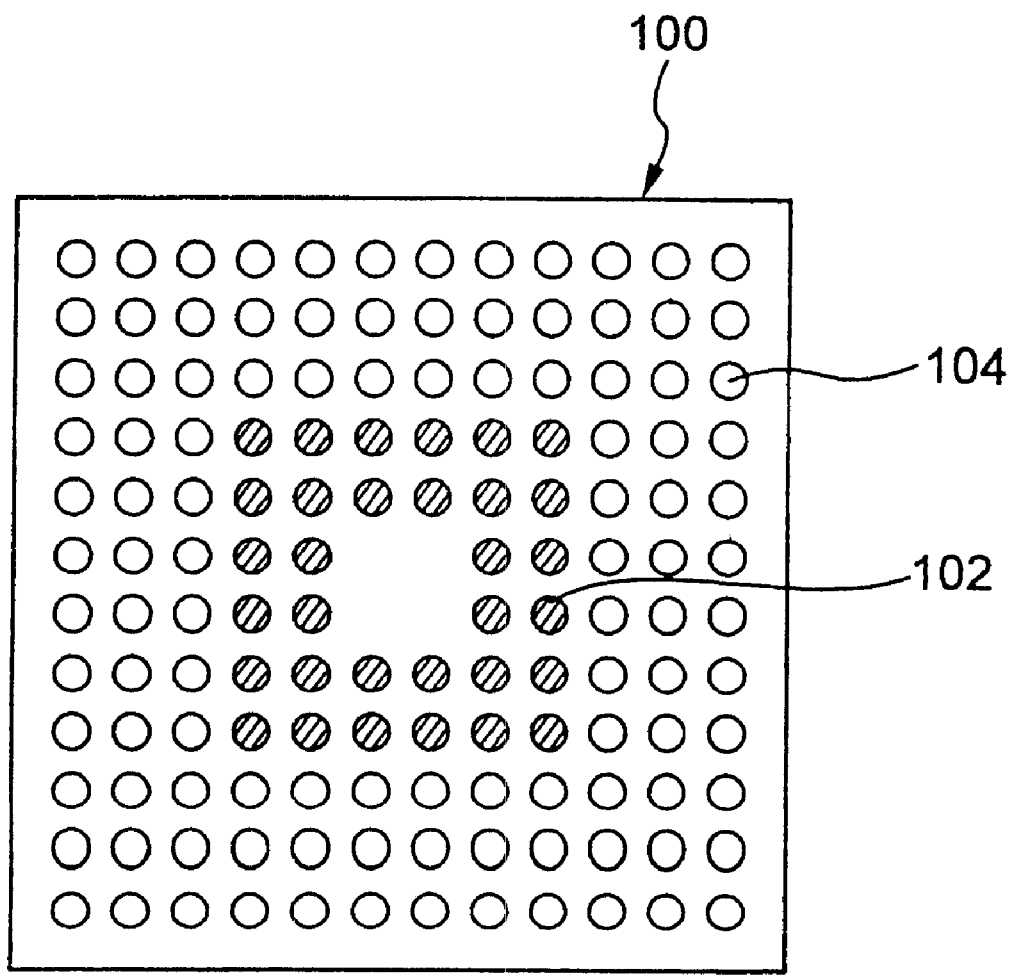
FIG. 16 is a plan view of a conventional wiring board.

Then, as shown in FIG. 15(b), a conductive layer 83 of a copper foil is bonded to the insulating layer 80. Subsequently, the conductive layers 81 and 82 are patterned to form terminals 81a, 81b and 81c on the reverse surface of the insulating layer 80, and pads 83a, 83b and 83c on the surface of the insulating layer 80. At this time, the terminals 81a, 81b and 81c are connected to the pads 83a, 83b and 83c via the conductive bumps 82a, 82b and 82c, respectively.

Then, if layers are stacked on the surface of the insulating layer 80 by the above described method in the third preferred embodiment, it is possible to obtain a multilayer printed circuit board or semiconductor package having terminals on both sides.

As described above, according to the present invention, even if signal wirings are closely arranged, it is possible to prevent crosstalk from occurring and it is possible to prevent the size from increasing.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A wiring board having a plurality of wiring layers, wherein a plurality of signal wiring terminals and a plurality of power supply terminals are arranged on a principal plane of said wiring board, said plurality of signal wiring terminals or said plurality of power supply terminals are connected to any one layer of inner layers of said wiring layers, and said plurality of signal wiring terminals comprises at least one rectangular region comprised of signal wiring terminals, wherein signal wiring terminals within each region are connected to said wirings formed on a layer associated with the region and wherein either the region is encircled by at least part of said power supply terminals or the region encircles at least part of said power supply terminals.

2. A wiring board as set forth in claim 1, wherein said power supply terminals have ground power supply terminals and driving power supply terminals, and said at least part of power supply terminals encircling said region or encircled by said region, in which said signal wiring terminals are formed, are said ground power supply terminals or said driving power supply terminals.

3. A wiring board as set forth in claim 2, wherein said at least part of power supply terminals encircling said region or encircled by said region, in which said signal wiring terminals are formed, are connected to a common wiring formed on the same layer.

4. A wiring board as set forth in claim 3, wherein the number k of signal wiring terminals, which are arranged on a column extending from an edge of said wiring board toward a central portion of said wiring board, among said signal wiring terminals encircled by said at least part of power supply terminals or encircling said at least part of power supply terminals are arranged so as to satisfy the following formula:

$$k \leq 1+(P-A-S)/(S+W)$$

wherein a size of each of said signal wiring terminals is A, a pitch between said signal wiring terminals is P, a width of each of said wirings is W, and a minimum dimension of a space between adjacent two of said wirings is S.

5. A wiring board as set forth in claim 4, wherein said power supply terminals are arranged in said central portion and the outermost portion of said wiring board.

6. A wiring board as set forth in claim 3, wherein said power supply terminals are arranged in said central portion and the outermost portion of said wiring board.

7. A semiconductor package having a plurality of wiring layers, wherein
a plurality of signal wiring terminals and a plurality of power supply terminals are arranged on a principal plane of said semiconductor package,
said plurality of signal wiring terminals or said plurality of power supply terminals are connected to any one layer of inner layers of said wiring layers, and
said plurality of signal wiring terminals comprises at least one rectangular region comprised of signal wiring terminals wherein signal wiring terminals within each region are connected to said wirings formed on a layer associated with the region and wherein either the region is encircled by at least part of said power supply terminals or the region encircles at least part of said power supply terminals.

8. A semiconductor package as set forth in claim 7, wherein said power supply terminals have ground power supply terminals and driving power supply terminals, and said at least part of power supply terminals encircling said region or encircled by said region, in which said signal wiring terminals are formed, are said ground power supply terminals or said driving power supply terminals.

9. A semiconductor package as set forth in claim 8, wherein said at least part of power supply terminals encircling said region or encircled by said region, in which said signal wiring terminals are formed, are connected to a common wiring formed on the same layer.

10. A semiconductor package as set forth in claim 9, wherein the number k of signal wiring terminals, which are arranged on a column extending from an edge of said semiconductor package toward a central portion of said semiconductor package, among said signal wiring terminals encircled by said at least part of power supply terminals or encircling said at least part of power supply terminals are arranged so as to satisfy the following formula:

$$k \leq 1+(P+A-S)/(S+W)$$

wherein a size of each of said signal wiring terminals is A, a pitch between said signal wiring terminals is P, a width of each of said wirings is W, and a minimum dimension of a space between adjacent two of said wirings is S.

11. A semiconductor package as set forth in claim 10, wherein said power supply terminals are arranged in said central portion and the outermost portion of said semiconductor package.

12. A semiconductor package as set forth in claim 9, wherein said power supply terminals are arranged in said central portion and the outermost portion of said semiconductor package.

13. A semiconductor device comprising:
a wiring board having a plurality of wiring layers, wherein a plurality of signal wiring terminals and a plurality of power supply terminals are arranged on a principal plane of said wiring board,
said plurality of signal wiring terminals or said plurality of power supply terminals are connected to any one layer of inner layers of said wiring layers, and
said plurality of signal wiring terminals comprises at least one rectangular region comprised of signal wiring terminals, wherein signal wiring terminals within each region are connected to said wirings formed on a layer associated with the region and wherein either the region is encircled by at least part of said power supply terminals or the region encircles at least part of said power supply terminals;
a semiconductor package having a plurality of wiring layers, wherein a plurality of signal wiring terminals and a plurality of power supply terminals are arranged on a principal plane of said semiconductor package, said plurality of signal wiring terminals or said plurality of power supply terminals being connected to any one layer of inner layers of said wiring layers, and
said plurality of signal wiring terminals comprises at least one rectangular region comprised of signal wiring terminals, wherein signal wiring terminals within each region are connected to said wirings formed on a layer associated with the region and wherein either the region is encircled by at least part of said power supply terminals or the region encircles at least part of said power supply terminals, said terminals on said principal plane being provided so as to correspond to said terminals of said wiring board; and
a semiconductor chip which is mounted on said semiconductor package and which is electrically connected to said semiconductor package, said terminals of said semiconductor package being connected to corresponding terminals of said wiring board.

14. A wiring board having a plurality of signal wiring layers and a plurality of first and second power supply terminals, which are arranged on a principal plane of said wiring board, wherein said first rectangular power supply terminals comprises a first region comprised of first power supply terminals, wherein either the first region is encircled by at least part of said signal wiring terminals or the first region encircles at least part of said signal wiring terminals, and said second power supply terminals comprises a second region comprised of second rectangular power supply terminals, wherein either the second region is encircled by at least part of said signal wiring terminals or the second region encircles at least part of said signal wiring terminals.

15. A wiring board as set forth in claim 14, wherein said second region is arranged within said first region, which is spaced from said second region via a third region, and all of terminals arranged in said third region are signal wiring terminals.

16. A wiring board as set forth in claim 15, wherein said wiring board is a multilayer printed circuit board having wiring layers of inner layers, and all of terminals electrically connected to wiring layers of said inner layers among said terminals arranged in said third region are electrically connected to the same wiring layer.

17. A semiconductor package having a plurality of signal wiring layers and a plurality of first and second power supply terminals, which are arranged on a principal plane of said semiconductor package, said first power supply terminals comprises a first rectangular region comprised of first power supply terminals, wherein either the first region is encircled by at least part of said signal wiring terminals or the first region encircles at least part of said signal wiring terminals, and said second power supply terminals comprises a second rectangular region comprised of a second power supply terminals, wherein either the second region is encircled by at least part of said signal wiring terminals or the second region encircles at least part of said signal wiring terminals.

18. A semiconductor package as set forth in claim 17, wherein said second region is arranged within said first region, which is spaced from said second region via a third region, and all of terminals arranged in said third region are signal wiring terminals.

19. A semiconductor package as set forth in claim 18, wherein said semiconductor package has multilayer wiring layers as inner layers, and all of terminals electrically connected to wiring layers of said inner layers among said terminals arranged in said third region are electrically connected to the same wiring layer.

* * * * *

UNITED STATES PATENT AND TRADEMARK OFFICE
CERTIFICATE OF CORRECTION

PATENT NO.  : 6,479,758 B1
DATED       : November 12, 2002
INVENTOR(S) : Arima et al.

It is certified that error appears in the above-identified patent and that said Letters Patent is hereby corrected as shown below:

Column 14,
Line 8, change "$k \leq 1+(P+A-S)/(S+W)$" to -- $k \leq 1+(P-A-S)/(S+W)$ --.
Line 65, change "rectangular power supply" to -- power supply --.
Line 66, change "comprises" to -- comprise --.
Line 66, change "first region" to -- first rectangular region --.

Column 15,
Line 3, change "comprises" to -- comprise --.
Lines 3-4, change "a second region" to -- a second rectangular region --.
Line 4, change "rectangular power supply" to -- power supply --.
Line 23, change "comprises" to -- comprise --.

Column 16,
Lines 4-5, change "comprises" to -- comprise --.
Lines 5-6, change "a second" (second occurrence) to -- second --.

Signed and Sealed this

Twenty-third Day of December, 2003

JAMES E. ROGAN
*Director of the United States Patent and Trademark Office*